(12) United States Patent
Kim et al.

(10) Patent No.: US 7,170,318 B2
(45) Date of Patent: Jan. 30, 2007

(54) IMPEDANCE CONTROLLER AND IMPEDANCE CONTROL METHOD

(75) Inventors: Tae-Hyoung Kim, Gyeonggi-do (KR); Nam-Seog Kim, Seoul (KR); Uk-Rae Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 100 days.

(21) Appl. No.: 11/031,244

(22) Filed: Jan. 6, 2005

(65) Prior Publication Data
US 2005/0146350 A1  Jul. 7, 2005

(30) Foreign Application Priority Data
Jan. 6, 2004  (KR) ............... 10-2004-0000517

(51) Int. Cl.
*H03K 19/0175* (2006.01)
(52) U.S. Cl. ............... 326/83; 326/30; 326/26; 326/87
(58) Field of Classification Search .......... 326/26, 326/27, 30, 82–90
See application file for complete search history.

(56) References Cited

U.S. PATENT DOCUMENTS 6,307,791 B1 *  10/2001  Otsuka et al. ......... 365/189.05
6,573,746 B1     6/2003  Kim et al.
6,839,286 B1 *   1/2005  Cho et al. ............. 365/189.05
6,947,336 B1 *   9/2005  Kim et al. ............. 365/189.05
6,980,020 B1 *  12/2005  Best et al. ................. 326/30
6,982,610 B1 *   1/2006  Govind ...................... 333/32
2003/0050838 A1  3/2003  Suzaki et al.
2005/0134303 A1* 6/2005  Best et al. ................. 326/30

FOREIGN PATENT DOCUMENTS

KR   2002-42093   6/2002

OTHER PUBLICATIONS

English language abstract of Korean Patent No. 10-394586, Publication No. 2002-42093, Jun. 5, 2002.

* cited by examiner

*Primary Examiner*—Don Le
(74) *Attorney, Agent, or Firm*—Marger Johnson & McCollom, P.C.

(57) ABSTRACT

An impedance controller includes a current mirror section to generate an impedance current. At least one detector includes a transistor array and an impedance corresponding to the impedance current, the at least one detector operating responsive to a code generator. And an at least one code generator generates a first code to adjust a gate voltage of the transistor array by comparing an output of the at least one detector to a reference voltage and generates a second code to adjust a size of the transistor array by comparing the output from the at least one detector to the reference voltage.

17 Claims, 6 Drawing Sheets

IMPEDANCE CONTROLLER AND IMPEDANCE CONTROL METHOD

CROSS-REFERENCE TO RELATED APPLICATION

This application claims priority from Korean Patent Application No. 2004-0000517, filed on Jan. 6, 2004 that we incorporate by reference.

BACKGROUND

1. Technical Field

The invention relates to a semiconductor device and, more particularly, to an impedance controller for impedance matching with an external device.

2. Discussion of the Related Art

A variety of semiconductor devices, such as microcomputers, memory devices and the like, are used to construct a variety of electrical products. In most cases, the semiconductor devices have input/output pins for receiving and transmitting external data, an output circuit for providing internal data to external devices, and the like. A semiconductor device may provide internal data to other semiconductor devices using a transmission line. In this case, the output impedance of the input/output pins and the impedance of the transmission line must be matched to optimize signal transmission.

One method for realizing impedance matching is to design a system with output impedance matching transmission line impedance and terminating an input to minimize reflective waves. In this method, however, an impedance difference arises due to temperature variations, process changes, and other operating environment characteristics that differ from the design environment. A need exists, therefore, for a device that provides constant impedance regardless of environmental changes. For this reason, some have devised a programmable impedance controller (PIC) capable of sensing transmission line characteristic impedance and providing relevant information to the output circuit. The PIC performs impedance matching according to an external resistor resistance when the resistor is connected to the system by a user. In addition, the controller matches internal to external impedance by actively updating a digital code in a certain period relative to environmental changes, e.g., changes in voltage and temperature.

One example of a conventional PIC is disclosed in U.S. Pat. No. 6,573,746 to Nam-Seog Kim et al. The '746 patent claims priority to Korean Patent No. 10-0394586 entitled Impedance Control Circuit, both the '746 patent and the Korean '586 patent are assigned to Samsung Electronic Co., Ltd.

Figure 1:
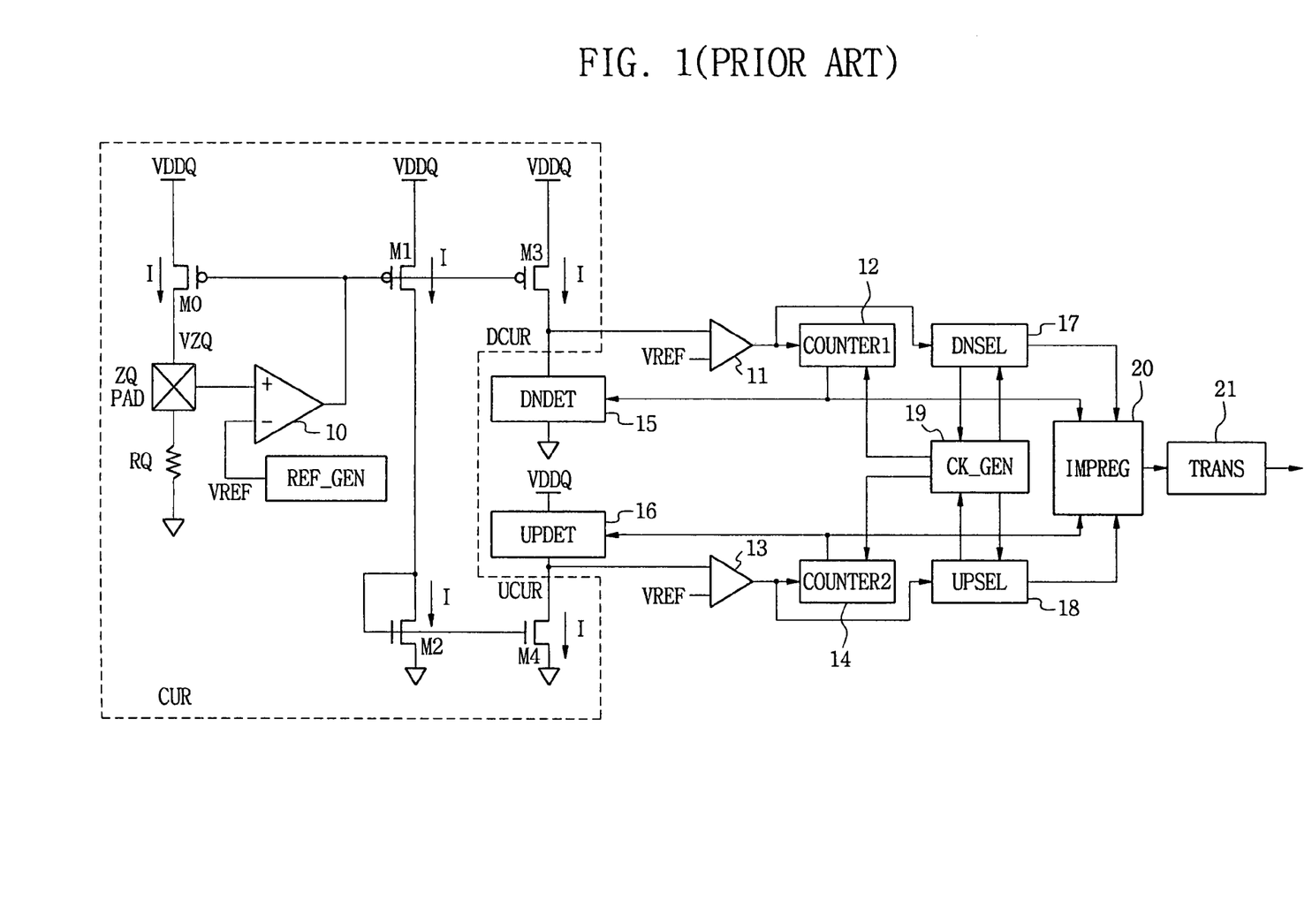
FIG. 1 is a schematic block diagram of a conventional impedance controller.

FIG. 1 is a block diagram of a PIC. Referring to FIG. 1, the PIC includes a current mirror section CUR for converting an external impedance RQ connected through a pad ZQ PAD (e.g., a chip pad), to a current I. Up and down detectors UPDET 16 and DNDET 15 include a transistor array that is programmed to have the same up and down impedance as the external impedance RQ. Up and down selectors UPSEL 18 and DNSEL 17 compare outputs from the detectors 15 and 16 to a reference voltage to control outputs of counters 12 and 14. The counters 12 and 14 generate digital impedance codes. A register IMPREG 20 stores the impedance codes and a code transmitter TRANS 21 serially transmits the impedance codes.

The PIC operates as follows. The current mirror section converts the external impedance RQ, connected with the pad ZQ PAD, to the current I as follows. The comparator 10, which is a component of the current mirror section CUR, compares a node voltage VZQ at the pad ZQ PAD to a reference voltage VREF to control a gate voltage of a PMOS transistor M0. If the node voltage VZQ is larger than the reference voltage VREF, the output from the comparator 10 increases, and in turn, an amount of a current flowing through the PMOS transistor M0 decreases. Since all the current flowing through the PMOS transistor M0 flows through the external impedance RQ, the node voltage VZQ will lower below a previous value. On the contrary, if the node voltage VZQ is smaller than the reference voltage VREF, the output of the comparator 10 decreases and, in turn, the amount of the current flowing through the PMOS transistor M0 increases. Since all the current flowing through the PMOS transistor M0 flows through the external impedance RQ, the node voltage VZQ will increase over the previous value. Through this process, the gate voltage of the PMOS transistor is controlled so that the node voltage VZQ has a value of VDDQ/2. At this time, the current I flowing through the PMOS transistor becomes VDDQ/2RQ.

The current I is also supplied to the up and down detectors 15 and 16 via the current mirror. The current I is duplicated and delivered to the down detector 15 by a PMOS transistor M3. Further, the same current I is duplicated and delivered to the up detector 16 by a PMOS transistor M1, a NMOS transistor M2, and a NMOS transistor M4.

A bias condition of the up and down detectors must be the same as the external impedance RQ so that the up and down detectors 15 and 16 have the same impedance as the external impedance RQ. In other words, when the up and down detectors 15 and 16 have output voltages UCUR and DCUR at VDDQ/2 and the current at VDDQ/2RQ, the up and down detectors 15 and 16 would have the same impedance as the external impedance RQ.

The comparators 11 and 13 compare the output voltage UCUR and DCUR from the up and down detectors 15 and 16 with the reference voltage VREF, e.g., VDDQ/2, to determine whether to increase or decrease the size of a transistor array that constitute the up and down detectors 15 and 16.

The outputs from the comparators 11 and 13 are delivered to first and second counters 12 and 14. The counters 12 and 14 generate impedance codes to program the up and down detectors 15 and 16.

The impedance codes outputted from the counters 12 and 14 are also sent to the up and down detectors 15 and 16 to control the size of the transistor array.

Thereafter, the output voltages UCUR and DCUR from the up and down detectors 15 and 16 are compared back to the reference voltage VREF by the comparators 11 and 13. This comparison result is sent to the counters 12 and 14.

The above-described impedance controller makes the output voltages UCUR and DCUR from up and down detectors 15 and 16 be VDDQ/2 through such series of processes so that the impedance of the up and down detectors 15 and 16 is the same as the external impedance RQ.

The selectors 17 and 18 serve to detect a dithering phenomenon and store the same impedance code as the external impedance RQ in the register 20. The dithering phenomenon may indicate when the output voltages UCUR and DCUR output from the detectors 15 and 16, respectively, are not exactly obtained as VDDQ/2 but have an amplitude with a quantization error. The quantization error may be based on the oscillating voltage VDDQ/2. The dithering phenomenon implies that since the impedance of the up and down detectors in the impedance controller is made as two values most similar to the external impedance RQ, the values must be detected to select an optimal one of two impedance codes.

The impedance codes stored in the register 20 by the selectors 17 and 18 are transmitted by the code transmitter 21, thus adjusting the output impedance.

Figure 2:
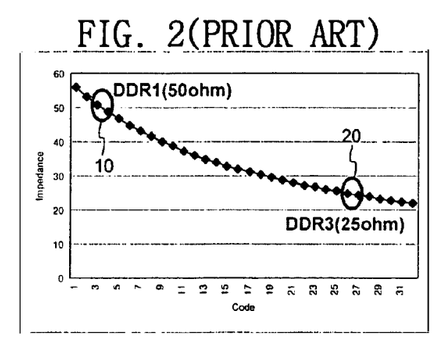
FIG. 2 shows a graph of an impedance code according to FIG. 1.
Figure 3:
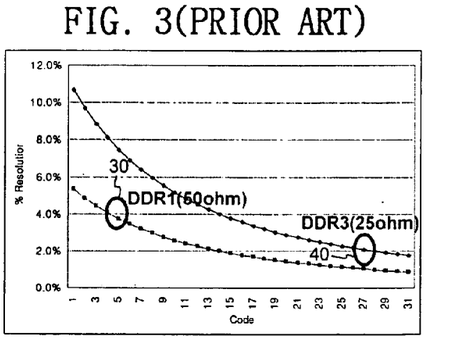
FIG. 3 shows a graph illustrating impedance resolution according to FIG. 1.

FIGS. 2 and 3 illustrate graphs showing impedance codes and impedance resolution for different external impedances in the impedance controller of FIG. 1.

FIG. 2 illustrates a graph of impedance codes according to impedance values, where an X axis denotes an impedance code and a Y axis denotes an impedance value. FIG. 2 demonstrates that when the external impedance is DDR1 (50Ω) and DDR3 (25Ω), an impedance code (i.e., 20) at the impedance value, DDR3 (25Ω), is larger than an impedance code (i.e., 10) at DDR1 (50Ω).

FIG. 3 illustrates a graph showing impedance codes and impedance resolution for respective external impedances, where an X axis denotes an impedance code and a Y axis denotes impedance resolution. It can be seen that when the external impedance is DDR1 (50Ω) and DDR3 (25Ω), the impedance resolutions dependent on the impedance code significantly differ as 40 and 30 at the impedance values, DDR3 (25%) and DDR1 (50%). In other words, if the controller is designed to meet both 50Ω and 25Ω, which correspond to DDR1 and DDR3, respectively, the DDR3 has impedance resolution of about 2% while the DDR1 has impedance resolution of about 4.4%.

Because a range of the impedance is determined by controlling the size of the transistor array that constitutes the detectors, the impedance resolution is high when the size of the transistor array is large and is low when the size of the transistor array is small. A problem arises that, when the impedance controller is applied to two systems having different external impedance, there exists a large difference in impedance resolution between the two systems. Another problem may be that the impedance code varies depending on change in processes, which affects the impedance resolution.

Accordingly a need remains for an improved impedance controller and an impedance control method.

SUMMARY OF THE INVENTION

An object of the invention to provide an improved impedance controller and an impedance control method.

It is another object of the invention to provide an impedance controller and an impedance control method capable of achieving the same impedance resolution even for different external impedances.

It is yet another object of the invention to provide an impedance controller and an impedance control method capable of achieving constant impedance irrespective of changes in external environments, such as changes in operation temperature, process, or the like.

It is yet another object of the invention to provide an impedance controller and impedance control method capable of achieving the same resolution without modifying a circuit in several systems having different external impedances.

In an embodiment, the impedance controller comprises a current mirror section to generate an impedance current. At least one detector that includes a transistor array and an impedance corresponding to the impedance current, the at least one detector operating responsive to a code generator. And an at least one code generator to generate a first code to adjust a gate voltage of the transistor array by comparing an output of the at least one detector to a reference voltage and to generate a second code to adjust a size of the transistor array by comparing the output from the at least one detector to the reference voltage.

The at least one detector may comprise a pull-up detector and a pull-down detector and the at least one code generator comprises a pull-up code generator to control the pull-up detector and a pull-down code generator to control the pull-down detector.

The current mirror section may include an external resistor connected between a ground and a pad, a comparator to generate an impedance control voltage by comparing a voltage at the pad to the reference voltage, a PMOS transistor to apply an impedance current corresponding to the impedance control voltage to the pad, and a current mirror to duplicate the impedance current at the pull-up and pull-down detectors.

The current mirror may include NMOS and PMOS transistors.

The pull-up code generator may include a first comparator to compare an output of the pull-up detector and the reference voltage, a first counter to generate the first and second codes responsive to the first comparator, a first reference ladder to adjust a gate voltage of the transistor array by selecting a node voltage from nodes in a plurality of resistors serially interconnected between a constant-voltage source and the ground responsive to the first code, a first dithering detector to generate a control signal that locks the first code responsive to the pull-up detector detecting a first state and to generate an update control signal responsive to the pull-up detector detecting a second state, and a first register to store the second code responsive to the update control signal.

The pull-down code generator may include a second comparator to compare the pull-down detector output and the reference voltage, a second counter to generate the first and second codes responsive to an output from the second comparator, a second reference ladder to adjust the gate voltage of the transistor array by selecting a node from nodes in a plurality of resistors serially interconnected between the constant-voltage source and the ground responsive to the first code, a second dithering detector to generate a second control signal that locks the first code responsive to the pull-down detector detecting a third state and to generate a second update control signal responsive to the pull-down detector detecting a fourth state, and a second register to store the second code responsive to the second update control signal.

The impedance controller may include a code transmitter to transmit the second code stored in the first register.

The impedance controller may include a code transmitter to transmit the second code stored in the second register.

A constant voltage applied by the constant-voltage source may be a power supply voltage.

The reference voltage may have a level of half a constant-source voltage.

In another embodiment, an impedance control method comprises digitally coding a current corresponding to an impedance control voltage, controlling a detector to have an impedance corresponding to the current, and generating an impedance code corresponding to the current to control a size of a transistor array.

The method may further comprise transmitting the impedance code after generating the impedance code.

Generating the impedance code may include adjusting a gate voltage of the transistor array by selecting a node voltage from a node in a plurality of serially interconnected resistors and generating the impedance code may include applying the node voltage to a gate of the transistor array responsive to the impedance code.

The reference voltage may have a level of half a constant-voltage source or half a power supply voltage.

In yet another embodiment, an impedance control method comprises generating an impedance control voltage by comparing a pad voltage at a pad connected with an external setup resistor to a reference voltage, digitally coding an impedance current corresponding to the impedance control voltage, generating first and second codes by comparing an output voltage to the reference voltage, adjusting a gate voltage of a transistor array responsive to the first code, effecting a first feedback process by comparing the output voltage and the reference voltage until the output voltage is substantially a voltage corresponding to the impedance current responsive to the first code, and effecting a second feedback process by comparing the output voltage and the reference voltage until the output voltage is substantially the voltage corresponding to the impedance current responsive to the second code.

Adjusting the gate voltage may include adjusting the gate voltage by selecting a node voltage from a plurality of nodes associated with a plurality of serially connected resistors responsive to the first code, the plurality of resistors being connected between ground and a constant-voltage source.

The method may further comprise setting the reference voltage to a level of half the constant voltage of the constant-voltage source or a power supply voltage.

BRIEF DESCRIPTION OF THE DRAWINGS

The above and other features and advantages of the invention will become more apparent to those of ordinary skill in the art by describing in detail preferred embodiments thereof with reference to the attached drawings.

DETAILED DESCRIPTION OF THE INVENTION

Hereinafter, preferred embodiments of the invention will be described with reference to FIGS. 4 to 11 only with the intention of assisting those skilled in the art in thoroughly understanding the invention.

Figure 4:
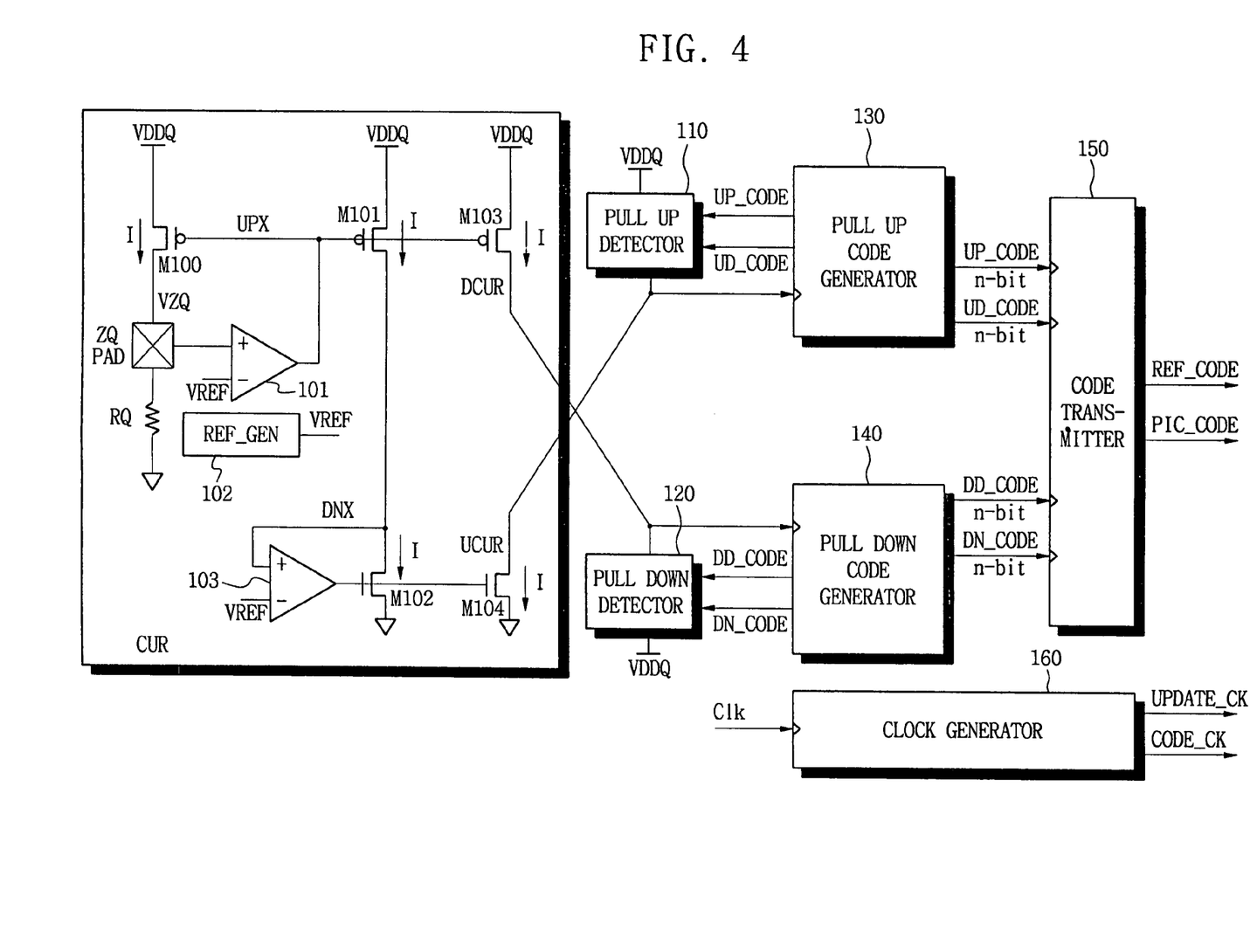
FIG. 4 is a schematic block diagram of an impedance controller according to an exemplary embodiment of the present invention.

FIG. 4 illustrates a schematic block diagram of an impedance controller according to an exemplary embodiment of the invention.

Referring to FIG. 4, the impedance controller includes a current mirror section CUR for generating an impedance current I. Pull-up and pull-down detectors 110 and 120 include an array of transistors and controlled by codes that control a gate voltage or a size of the transistor array. Pull-up and pull-down code generators 130 and 140 generate codes that control the pull-up and pull-down detectors 110 and 120, respectively. And a code transmitter 150 transmits an impedance code corresponding to the impedance current. The impedance controller includes a clock generator 160 to generate a clock used for the impedance controller.

The current mirror section CUR includes an external resistor RQ connected between a ground and a chip pad ZQ PAD and having resistance corresponding to an external impedance. A comparator 101 compares a voltage VZQ at the pad ZQ PAD to a reference voltage VREF to output an impedance control voltage UPX. A PMOS transistor M100 connected between a constant-voltage source VDDQ and the pad ZQ PAD receives the impedance control voltage UPX from the comparator 101 at a gate and applies an impedance current I corresponding to the impedance control voltage UPX, to the pad. A current mirror of NMOS transistors M102 and M104 duplicates the current I that is in the PMOS transistor M100 and applies the duplicated current I to the pull-up detector 110. And a current mirror of PMOS transistors M101 and M103 duplicates the current I that is in the PMOS transistor M100 and applies the duplicated current I to the pull-down detector 120.

The pull-up and pull-down detectors 110 and 120 include an array of transistors. The gate voltage and size of the array of transistors may be controlled by the relevant pull-up and pull-down code generators 130 and 140 so that the detectors 110 and 120 have the same impedance as the external impedance RQ.

The pull-up and pull-down code generators 130 and 140 compare the output node voltages UCUR and DCUR from the pull-up and the pull-down detectors 110 and 120 to a reference voltage VDDQ/2 to determine whether to increase or decrease the impedance of the pull-up and pull-down detectors 110 and 120. If the output node voltages DCUR and UCUR from the pull-up and pull-down detectors 110 and 120, respectively, cause a dithering phenomenon due to the digital control, the respective code generators send a gate voltage adjustment code and an impedance code to the code transmitter 150.

The code transmitter 150 synchronizes the gate voltage code and the impedance code received from the code generators 130 and 140 to a transmission clock, and transmits the codes in series.

The clock generator 160 generates the clock that will be used in the impedance controller.

Figure 5:
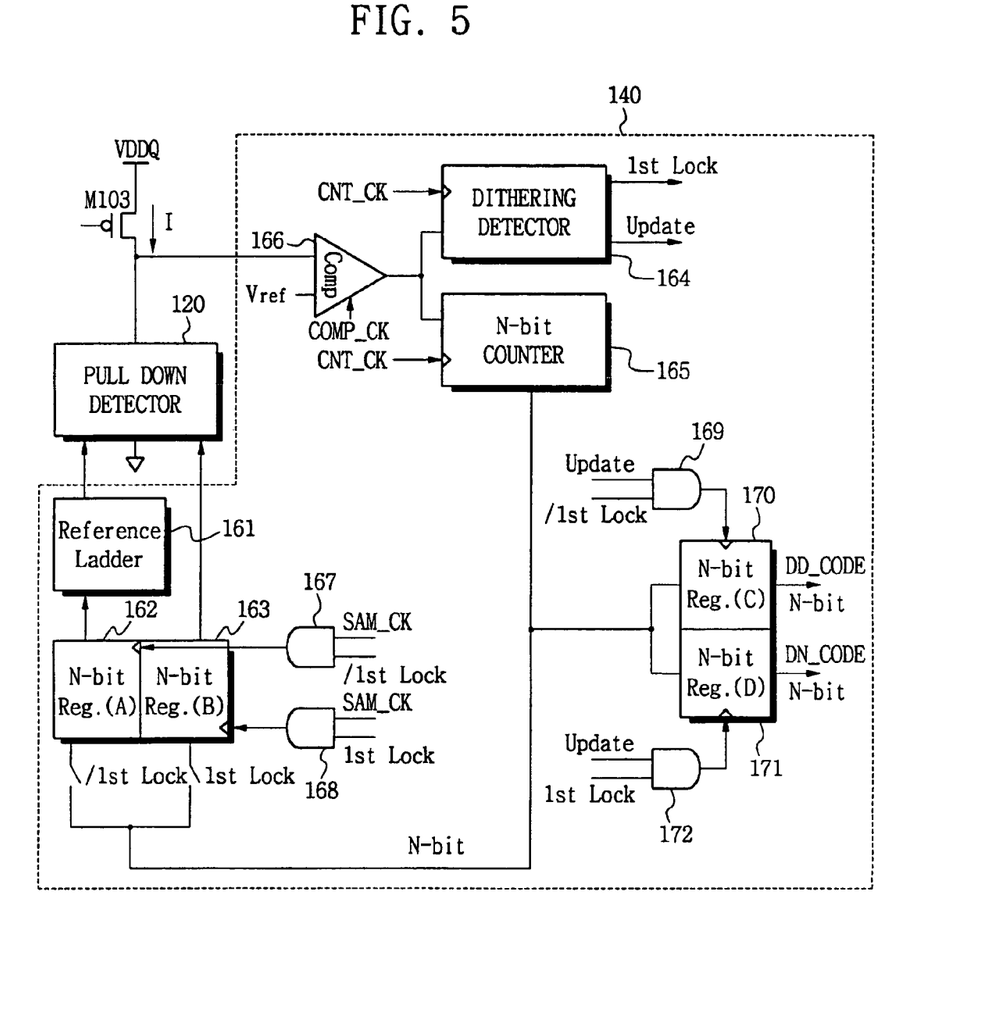
FIG. 5 is a detailed block diagram of a pull-down code generator of FIG. 4.
Figure 6:
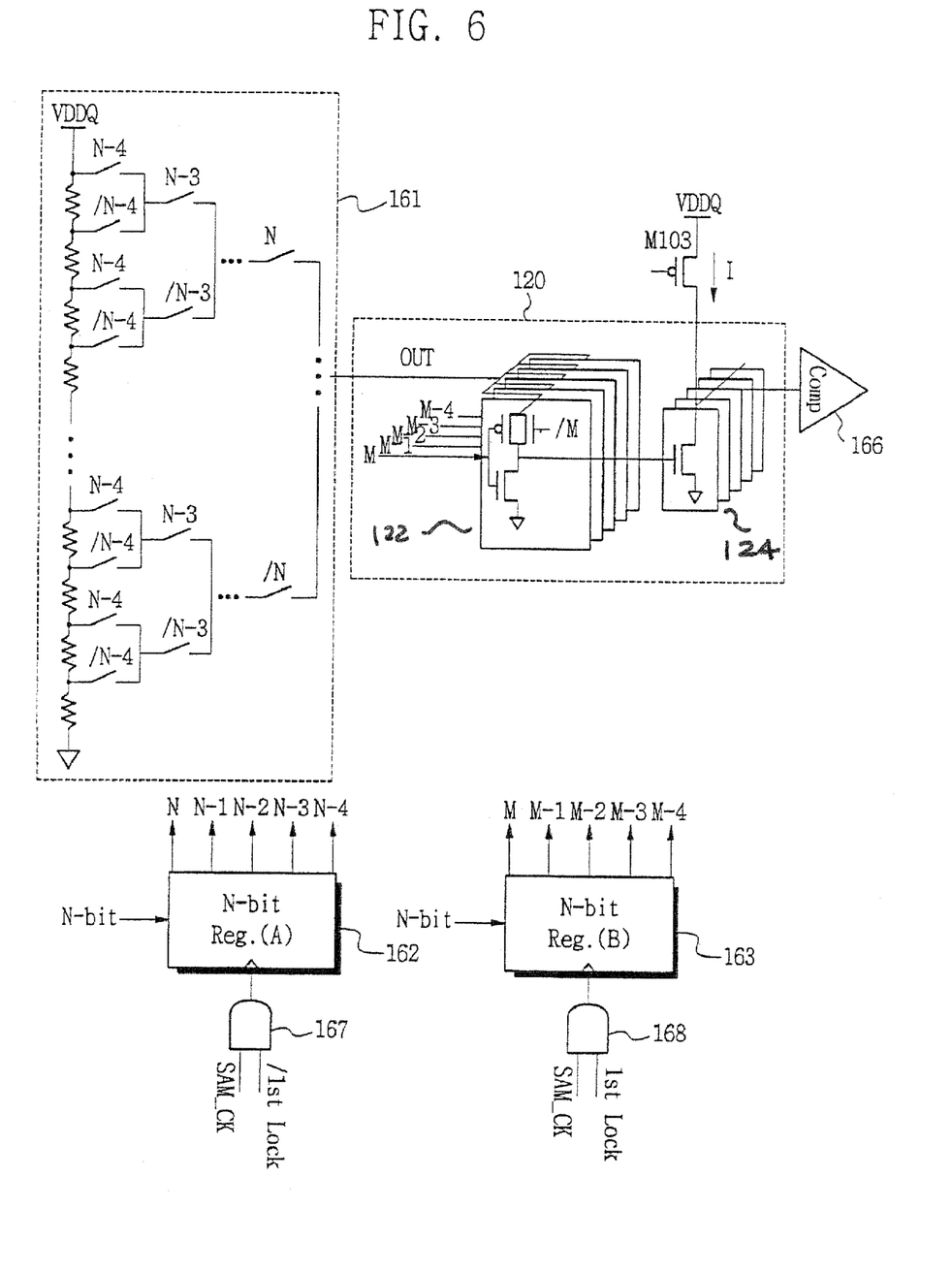
FIG. 6 is a detailed block diagram of a reference ladder and a pull-down detector of FIG. 5.

FIG. 5 illustrates a detailed block diagram of the pull-down code generator 140, and FIG. 6 illustrates a block diagram of a reference ladder 161 and the pull-down detector 120.

As shown in FIG. 5, the pull-down code generator 140 includes a comparator 166 to compare the output of the pull-down detector to the reference voltage. A counter 165 generates a first code for adjusting the gate voltage of the transistor array 124 of the pull-down detector 120, and a second code for controlling the array size selector 122 to adjust the size of the transistor array 124 in response to the output from the comparator 166. A register N-bit Reg (A) 162 stores the first code therein and a register N-bit Reg (B) 163 stores the second code therein. A reference ladder 161 adjusts the gate voltage of the transistor array 124 of the pull-down detector 120, in response to the first code. A dithering detector 164 generates a control signal 1st Lock for locking the first code when the output from the pull-down detector 120 adjusted by the reference ladder 161 is close to or matches the impedance current. A control signal Update gets updated when the output from the pull-down detector 120 adjusted by the second code output is close to or matches the impedance current. And a register N-bit Reg (D) 171 stores the second code therein in response to the update control signal Update and a register N-bit Reg (C) 170 stores the first locked code.

As shown in FIG. 6, the reference ladder 161 that is a component of the pull-down code generator 140, adjusts a gate voltage by selecting a node voltage from nodes in a plurality of resistors connected in series between the constant-voltage source VDDQ and a ground and by connecting the selected node voltage to the gate of the transistor array 124 of the pull-down detector 120 in response to the first code received from the register 162.

The constant voltage VDDQ that is generated from the above-described constant-voltage source may have a level of the power supply voltage, and the reference voltage VREF may have a level VDDQ/2, which is half the constant voltage.

Figure 7:
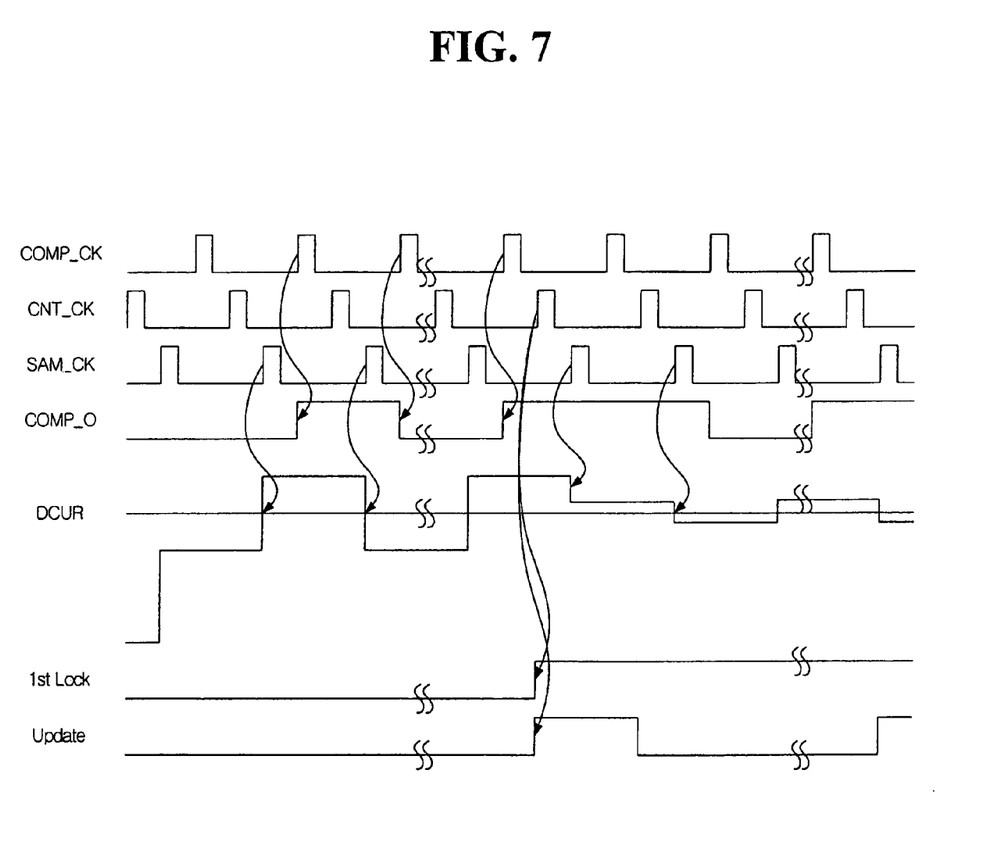
FIG. 7 is an operational timing diagram of FIG. 5.

FIG. 7 illustrates an operational timing diagram of the pull-down code generator 140.

Hereinafter, the operation of the impedance controller according to an exemplary embodiment of the invention will be described with reference to FIGS. 2 to 7.

First, the current mirror section CUR converts the external impedance RQ, connected to the pad ZQ PAD, to a current in the following process.

The comparator 101 compares the node voltage VZQ at the pad ZQ PAD to the reference voltage VREF to control the gate voltage of the PMOS transistor M100. If the node voltage VZQ is larger than the reference voltage VREF, the output of the comparator 101 increases and the amount of a current flowing through the PMOS transistor M100, in turn, decreases. Since all current flowing through the PMOS transistor M100 flows through the external impedance RQ, the node voltage VZQ lowers below the previous value. On the contrary, if the node voltage VZQ is smaller than the reference voltage VREF, the output of the comparator 101 lowers and in turn the amount of the current flowing through the PMOS transistor M100 increases. Since all the current flowing through the PMOS transistor M100 flows through the external impedance RQ, the node voltage VZQ will become higher than a previous value. Through this process, the gate voltage of the PMOS transistor M100 is controlled so that the node voltage VZQ has a value of VDDQ/2. At this time, the current I flowing through the PMOS transistor becomes VDDQ/2RQ.

The current I is duplicated and delivered to the pull-down detector 120 by the PMOS transistor M103. Further, the current I is duplicated and delivered to the pull-up detector 110 by the PMOS transistors M101 and the NMOS transistors M102 and M104.

The pull-down detector 120 is controlled by the pull-down code generator 140 to have an impedance corresponding to the delivered current I. The register 163, which stores the second code, namely, the impedance code from the pull-down code generator 140, maintains a previously stored initial value. The size of the transistor array 124 of the pull-down detector 120 is maintained by the array size selector 122 and the initial value of the second code, and the resultant output voltage DCUR from the pull-down detector is sent to the comparator 166.

The comparator 166 operates with the clock signal COMP_CK, compares the reference voltage to the output DCUR from the pull-down detector 120, and sends the output COMP_O from the comparator 166 to the counter 165. The counter 165 is synchronized to the clock signal CNT_CK and samples the output of the comparator 166. For example, if the output DCUR of the pull-down detector 120 is larger than the reference voltage VREF, the output from the comparator 166 becomes a logical value '1', and the logical value is sent to the counter 165 to increase the subsequent output from the counter 165. Further, if the output DCUR of the pull-down detector 120 is smaller than the reference voltage VREF, the output of the comparator 166 becomes a logical value '0' and this logical value is sent to the counter 165 to decrease the subsequent output of the counter 165.

The increased or decreased output of the counter 165 is stored in the register 162 by the sampling clock signal SAM_CK, and the first code stored in the register 162 controls the reference ladder 161 to adjust the gate voltage of the transistor array 124, which is applied to the pull-down detector. For example, the increasing output of the counter 165 increases the voltage that is delivered to the pull-down detector 120. The increasing input voltage to the pull-down detector 120 increases the amount of the current relative to the same size of the array of transistors, which serves to lower the output from the pull-down detector 120.

The output from the pull-down detector 120 is compared to a reference voltage by the comparator 166. This first feedback process continues until the dithering phenomenon occurs.

If the dithering phenomenon occurs, the output DCUR from the pull-down detector 120 is close to the VDDQ/2 and the dithering detector 164 generates a control signal 1st Lock, which locks the first code, and an update signal Update. The first code outputted from the counter 165 is stored in the register 170. This feedback process adjusts the gate voltage of the transistor array, 124 of the pull-down detector 120.

Once the dithering phenomenon firstly occurs, a logic 'high' state remains after the control signal 1st Lock, which locks the first code, is activated, and accordingly, the reference ladder 161, the register 162 and the register 170, which operates in the state where the control signal that locks the first code is inactive, does not operate any more.

The second feedback process is a process of creating a desired impedance code by adjusting the size of the transistor array 124 of the pull-down detector 120 with respect to the gate voltage determined after the above-mentioned operation is completed.

After the gate voltage is determined, the output from the counter 165 is connected to and is stored in the register 163. The register 163 stores impedance codes. The impedance codes, namely, the second code stored in the register 163 controls the array size selector 122 to adjust the size of the transistor array 124 of the pull-down detector 120 to thereby change the output DCUR from the pull-down detector.

The comparator 166 compares the output DCUR from the pull-down detector 120 to the reference voltage, and sends the resultant output to the counter 165. The counter 165 then generates the second code to adjust the output DCUR from the pull-down detector 120. This feedback process continues until a second dithering phenomenon occurs. At this time, an impedance code created through the second feedback process does not greatly deviate from the initial value since the dithering phenomenon is already occurring with respect to the initial value of the impedance code through the first feedback process. If the second dithering phenomenon occurs, the dithering detector 164 generates the data control signal Update and stores it in the impedance code register 171 to send the output from the counter 165 to the code transmitter 150. After the control signal 1st Lock that locks the first code changes to 'high,' the register 171 stores a new impedance code in response to the update control signal Update received whenever the dithering phenomenon occurs.

Although above-described configuration and operation have been primarily described in connection with the pull-down detector 120 and the pull-down code generator 140, it will be apparent to those skilled in the art that the configuration and operation of the pull-up detector 110 and the pull-up code generator 130 are identical or similar to those described above.

With the above-described impedance controller, similar or the same impedance code is created irrespective of the external impedance value through such series of processes, which allows constant impedance resolution to be achieved with respect to a variety of external impedances. Further, if different external impedances are required according to systems, it is possible to maintain impedance resolution uniform by automatically maintaining only the gate voltage of the transistor arrays of the detectors 110 and 120.

FIGS. 8 to 11 illustrate graphs showing impedance codes and impedance resolution for different external impedances in the impedance controller according to the above-described exemplary embodiment of the invention.

Figure 8:
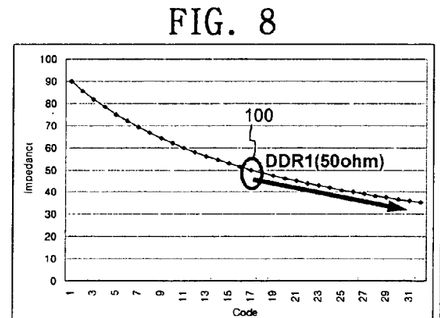
FIGS. 8 and 10 show graphs illustrating impedance codes according to FIG. 4.
Figure 9:
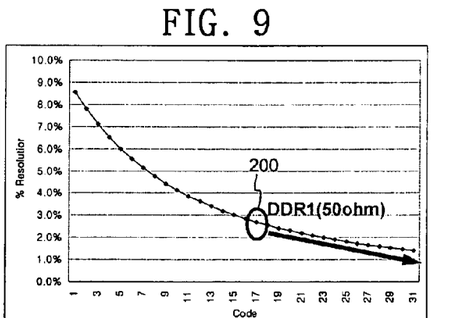
FIGS. 9 and 11 show graphs illustrating an impedance resolution according to FIG. 4.
Figure 10:
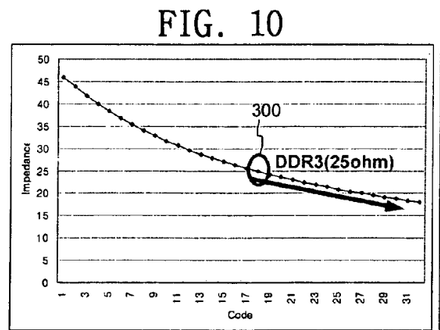
Figure 11:
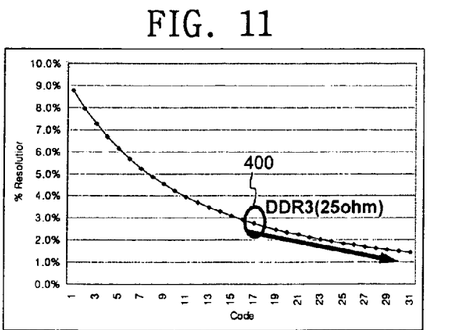

FIGS. 8 and 10 illustrate graphs showing impedance codes depending on change in impedance values, where an X axis denotes an impedance code and a Y axis denotes an impedance value. FIGS. 9 and 11 illustrate graphs showing a relationship between an impedance code and impedance resolution for external impedance, where an X axis denotes an impedance code and a Y axis denotes impedance resolution.

As shown in FIGS. 8 to 11, it will be appreciated that in the invention, both have impedance resolutions 200 and 400 of 2.5% irrespective of DDR (150Ω) or DDR3 (25Ω) since the impedance is automatically controlled depending on the external impedance value. Further, it will be appreciated that similar impedance codes 100 and 300 are achieved. With the impedance controller according to the above-described exemplary embodiment of the invention, more improved impedance resolution can be achieved by changing the initial values of the registers 162 and 163.

Since the exemplary embodiments have been only illustrated by way of example with reference to the accompanying drawings to assist in thoroughly understanding the invention, it should not be construed as limiting the invention. Further, it will be apparent to those skilled in the art that a variety of changes and modifications may be made to the invention departing from the scope and spirit of the invention. For example, it will be apparent that the internal configuration of the circuit may be modified and internal components of the circuit may be substituted by other equivalents, if necessary.

As described above, with the impedance controller according to the invention, the same impedance resolution can be achieved even for different external impedances, and constant impedance can be achieved irrespective of changes in an external environment, such as changes in temperature, process, and the like. Further, with the impedance controller, the same impedance resolution can be achieved without modifying a circuit in several systems having different external impedance.

We claim:

1. An impedance controller, comprising:
   a current mirror section to generate an impedance current;
   at least one detector including a transistor array having an impedance corresponding to the impedance current; and
   at least one code generator to generate a first code, a gate voltage of the transistor array being adjusted responsive to the first code by comparing an output of the at least one detector to a reference voltage and to generate a second code, a size of the transistor array being adjusted responsive to the second code by comparing the output from the at least one detector to the reference voltage.

2. The impedance controller of claim 1
   where the at least one detector comprises a pull-up detector and a pull-down detector; and
   where the at least one code generator comprises a pull-up code generator to control the pull-up detector and a pull-down code generator to control the pull-down detector.

3. The impedance controller of claim 2 where the current mirror section includes:
   an external resistor connected between a ground and a pad;
   a comparator to generate an impedance control voltage by comparing a voltage at the pad to the reference voltage;
   a PMOS transistor to apply an impedance current corresponding to the impedance control voltage to the pad;
   a current mirror to duplicate the impedance current at the pull-up and pull-down detectors.

4. The impedance controller of claim 3 where the current mirror includes NMOS and PMOS transistors.

5. The impedance controller of claim 2 where the pull-up code generator includes:
   a first comparator to compare an output of the pull-up detector and the reference voltage;
   a first counter to generate the first and second codes responsive to the first comparator;
   a first reference ladder to adjust a gate voltage of the transistor array by selecting a node voltage from nodes in a plurality of resistors serially interconnected between a constant-voltage source and the ground responsive to the first code;
   a first dithering detector to generate a control signal that locks the first code responsive to the pull-up detector detecting a first state and to generate an update control signal responsive to the pull-up detector detecting a second state; and
   a first register to store the second code responsive to the update control signal.

6. The impedance controller of claim 5 where the pull-down code generator includes:
   a second comparator to compare the pull-down detector output and the reference voltage;
   a second counter to generate the first and second codes responsive to an output from the second comparator;
   a second reference ladder to adjust the gate voltage of the transistor array by selecting a node from nodes in a plurality of resistors serially interconnected between the constant-voltage source and the ground responsive to the first code;
   a second dithering detector to generate a second control signal that locks the first code responsive to the pull-down detector detecting a third state and to generate a second update control signal responsive to the pull-down detector detecting a fourth state; and
   a second register to store the second code responsive to the second update control signal.

7. The impedance controller of claim 5 comprising a code transmitter to transmit the second code stored in the first register.

8. The impedance controller of claim 5 comprising a code transmitter to transmit the second code stored in the second register.

9. The impedance controller of claim 8 where a constant voltage applied by the constant-voltage source is a power supply voltage.

10. The impedance controller of claim 7 where the reference voltage has a level of half a constant-source voltage.

11. An impedance control method comprising:
digitally coding a current corresponding to an impedance control voltage;
controlling a detector to have an impedance corresponding to the current;
generating a first impedance code corresponding to the current to control a gate voltage of a transistor array; and
generating a second impedance code corresponding to the current to control a size of the transistor array.

12. The method of claim 11 comprising:
transmitting the impedance codes after generating the impedance codes.

13. The method of claim 12 where generating the first impedance code includes adjusting the gate voltage of the transistor array responsive to a node voltage from a node in a plurality of serially interconnected resistors.

14. The method of claim 13 where a reference voltage has a level of half a constant-voltage source or half a power supply voltage.

15. An impedance control method comprising:
generating an impedance control voltage by comparing a pad voltage at a pad connected with an external setup resistor to a reference voltage;
digitally coding an impedance current corresponding to the impedance control voltage;
generating first and second codes by comparing an output voltage to the reference voltage;
adjusting a gate voltage of a transistor array responsive to the first code;
running a first feedback process by comparing the output voltage and the reference voltage until the output voltage is substantially a voltage corresponding to the impedance current responsive to the First code; and
running a second feedback process by comparing the output voltage and the reference voltage until the output voltage is substantially the voltage corresponding to the impedance current responsive to the second code.

16. The method of claim 15 where adjusting the gate voltage includes adjusting the gate voltage by selecting a node voltage from a plurality of nodes associated with a plurality of serially connected resistors responsive to the first code, the plurality of resistors being connected between ground and a constant-voltage source.

17. The method of claim 16 comprising setting the reference voltage to a level of half the constant voltage of the constant-voltage source or a power supply voltage.

* * * * *

UNITED STATES PATENT AND TRADEMARK OFFICE
CERTIFICATE OF CORRECTION

PATENT NO. : 7,170,318 B2
APPLICATION NO. : 11/031244
DATED : January 30, 2007
INVENTOR(S) : Tae-Hyoung Kim et al.

It is certified that error appears in the above-identified patent and that said Letters Patent is hereby corrected as shown below:

Column 3, line 24, the words "DDR 3 (25%) and DDR1 (50%)." should read -- DDR3 (25Ω) and DDR1 (50Ω). --;
Column 12, line 15, the word "First" should read -- first --.

Signed and Sealed this

Twenty-sixth Day of August, 2008

JON W. DUDAS
*Director of the United States Patent and Trademark Office*